United States Patent
Chou et al.

(10) Patent No.: US 9,229,064 B2
(45) Date of Patent: Jan. 5, 2016

(54) METHOD FOR ESTIMATING BATTERY DEGRADATION

(71) Applicant: Industrial Technology Research Institute, Hsinchu (TW)

(72) Inventors: Chung-Jen Chou, Yunlin County (TW); Chein-Chung Sun, Kaohsiung (TW); Chiu-Yu Liu, Kaohsiung (TW); Ying-Hao Hsu, Kaohsiung (TW); Heng-Hui Tu, New Taipei (TW); Shou-Hung Ling, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 576 days.

(21) Appl. No.: 13/645,523

(22) Filed: Oct. 5, 2012

(65) Prior Publication Data

US 2013/0166234 A1    Jun. 27, 2013

(51) Int. Cl.
G01R 31/36 (2006.01)
G06F 11/30 (2006.01)

(52) U.S. Cl.
CPC .................. G01R 31/3679 (2013.01)

(58) Field of Classification Search
CPC .................................................. G01R 31/3679
See application file for complete search history.

(56) References Cited

U.S. PATENT DOCUMENTS

| | | | |
|---|---|---|---|
| 6,433,513 B1 | 8/2002 | Hayashi | |
| 6,529,840 B1 * | 3/2003 | Hing | 702/63 |
| 6,832,171 B2 | 12/2004 | Barsoukov et al. | |
| 7,675,291 B2 | 3/2010 | Matsuo et al. | |
| 7,688,033 B2 | 3/2010 | Minamiura | |
| 7,693,671 B2 | 4/2010 | Okumura et al. | |
| 2005/0225301 A1 | 10/2005 | Arnold et al. | |
| 2010/0188053 A1 * | 7/2010 | Carkner et al. | 320/152 |
| 2011/0133744 A1 | 6/2011 | Ono et al. | |
| 2011/0161025 A1 | 6/2011 | Tomura et al. | |

FOREIGN PATENT DOCUMENTS

| | | |
|---|---|---|
| CN | 1391305 | 1/2003 |
| CN | 101031810 | 9/2007 |
| CN | 101726705 | 6/2010 |

(Continued)

OTHER PUBLICATIONS

"Notice of Allowance of Taiwan counterpart application" issued on Dec. 10, 2013, p. 1-p. 4.

(Continued)

*Primary Examiner* — Phuong Huynh
(74) *Attorney, Agent, or Firm* — Jianq Chyun IP Office

(57) ABSTRACT

A method for estimating battery degradation is provided. In this method, a remaining capacity is obtained by looking up a device characteristic table according to a steady open circuit voltage of a battery. Besides, a constant current is provided to charge the battery, and when a terminal voltage of the battery reaches to a charging preset voltage, a constant voltage is provided to charge the battery. The transition point information at the transition from a constant current mode to a constant voltage mode, which includes a transition point estimated open circuit voltage, a transition point voltage, a transition point current and a transition point battery temperature, is analyzed based on voltage, current, temperature and capacity information measured during the charging process. A battery degradation index is calculated from the transition point information.

11 Claims, 5 Drawing Sheets

(56) References Cited

FOREIGN PATENT DOCUMENTS

| | | |
|---|---|---|
| CN | 102175978 | 9/2011 |
| CN | 102200568 | 9/2011 |
| JP | 2007-178333 | 7/2007 |
| JP | 2010-60408 | 3/2010 |
| TW | 200827754 | 7/2008 |
| TW | 201013382 | 4/2010 |
| TW | I338397 | 3/2011 |
| TW | 201141000 | 11/2011 |

OTHER PUBLICATIONS

Shi et al., "Research on SOC estimation for LiFePO4 Li-ion batteries," Journal of Electronic Measurement and Instrument, Aug. 2010, pp. 769-774.

"Office Action of China Counterpart Application", issued on Sep. 28, 2014, p. 1-p. 5.

* cited by examiner

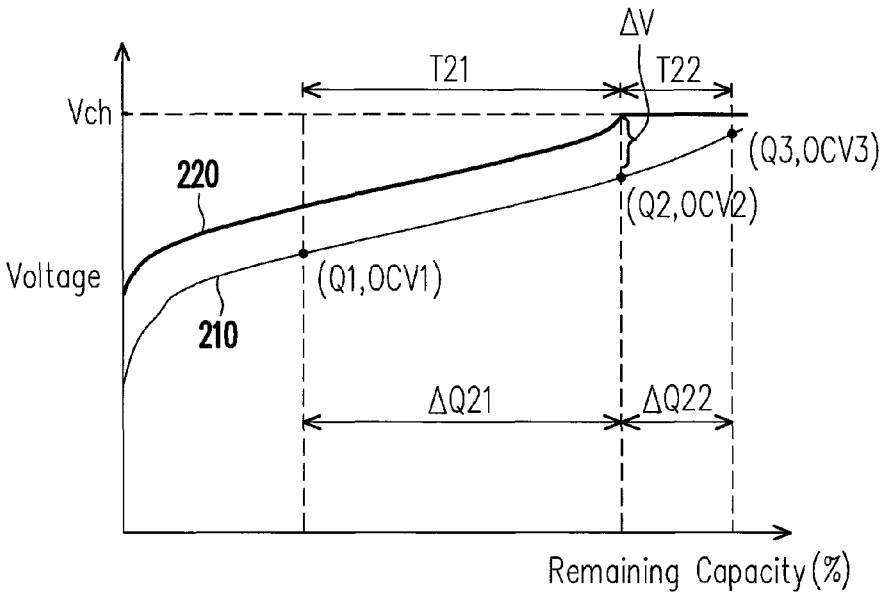

FIG. 2A

| A constant current is provided to charge the battery and a transition point voltage is provided to charge the battery when a terminal voltage of the battery reaches a charging preset voltage | — S120 |
| A charged capacity of the battery obtained in the constant voltage mode is accumulated | — S210 |
| The battery is rested to obtain a steady open circuit voltage of the battery and the steady open circuit voltage is used to look up the device characteristic table to obtain a lookup capacity | — S220 |
| A transition point capacity is obtained by subtracting the charged capacity from the lookup capacity | — S230 |
| A transition point estimated open circuit voltage is obtained by looking up the device characteristic table again according to the transition point capacity | — S240 |

FIG. 2B

METHOD FOR ESTIMATING BATTERY DEGRADATION

CROSS-REFERENCE TO RELATED APPLICATION

This application claims the priority benefit of Taiwan application serial no. 100148621, filed on Dec. 26, 2011. The entirety of the above-mentioned patent application is hereby incorporated by reference herein and made a part of this specification.

TECHNICAL FIELD

The technical field relates to a method for estimating battery degradation.

BACKGROUND

Batteries gradually deteriorate due to various factors such as the change of using environment and the increase of number of charging/discharging cycles. During the deteriorating process, various measuring tools are used to measure degradation parameters of the battery to determine whether the battery is still suitable for use.

Some techniques have been proposed for measuring the battery degradation parameters, for example, in US Patent Application Publication No. 2011/133744, U.S. Pat. No. 6,832,171, U.S. Pat. No. 6,433,513 and JP Patent Application Publication No. 2007-178333. US Patent Application Publication No. 2011/133744 utilizes an interference source to detect an internal resistance of a battery and thereby determine degradation degrees of the battery. However, in this method, an additional device is required to generate the interference source, which increases the system hardware cost.

In addition, U.S. Pat. No. 6,832,171 detects a remaining available capacity and capacity degradation information of a battery by recording an impedance curve of the battery. Besides, U.S. Pat. No. 6,433,513 determines the degradation degrees of a battery and predicts its service life based on a charged amount corresponding to a voltage period of the battery during charging. However, both above methods require a huge table to be established for recording or calculating the degradation degrees and a continuous update of the recorded data, thereby increasing the system complexity.

In JP Patent Application Publication No. 2007-178333, when the battery is switched from a constant current charging to a constant voltage charging, the battery is first rested for a period of time and a voltage change rate of the battery is measured to thereby detect the degradation degrees of the battery. However, in this method, the charging operation of the battery is required to be interrupted to measure the battery degradation.

SUMMARY

One of exemplary embodiments comprises a method for estimating battery degradation. In this method, a battery is charged with a constant current/constant voltage mixed charging procedure. The battery is charged in a constant current mode when a terminal voltage of the battery has not reached a charging preset voltage, and the battery is charged in a constant voltage mode when the terminal voltage of the battery has reached the charging preset voltage. A degradation index of the battery is calculated based on a transition point voltage, a transition point estimated open circuit voltage, a transition point current, and a transition point battery temperature at a transition from the constant current mode to the constant voltage mode during the constant current/constant voltage mixed charging procedure.

One of exemplary embodiments comprises a method for estimating battery degradation. In this method, a battery is charged with a constant current/constant voltage mixed charging procedure. The battery is charged in a constant current mode when a terminal voltage of the battery has not reached a charging preset voltage, and the battery is charged in a constant voltage mode when the terminal voltage of the battery has reached the charging preset voltage. A transition point current and a transition point battery temperature are recorded when the constant current/constant voltage mixed charging procedure switches from the constant current mode to the constant voltage mode. A variant current of the battery is detected after the battery is charged in the constant voltage mode for a preset period of time, and a degradation index is calculated based on the transition point current, the transition point battery temperature and the variant current.

Several exemplary embodiments accompanied with figures are described in detail below to further describe the disclosure in detail.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 2A is a characteristic curve diagram of a battery according to an exemplary embodiment.

FIG. 2B is a flow chart of obtaining a transition point estimated OCV according to another exemplary embodiment.

DETAILED DESCRIPTION OF THE DISCLOSED EMBODIMENTS

During the charging process of a battery, the step transition from the constant current to the constant voltage is a relative stable operation during the charging process. Therefore, in exemplary embodiments, the battery degradation is evaluated based on relevant parameters at the transition from the constant current to the constant voltage during the charging process. As such, in exemplary embodiments, the battery degradation can be estimated without the need of any additional circuit and without interrupting the charging operation. Below, the method for estimating battery degradation is described by way of exemplary examples. The inventive concept may be embodied in various forms without being limited to the exemplary embodiments set forth herein.

Figure 1:
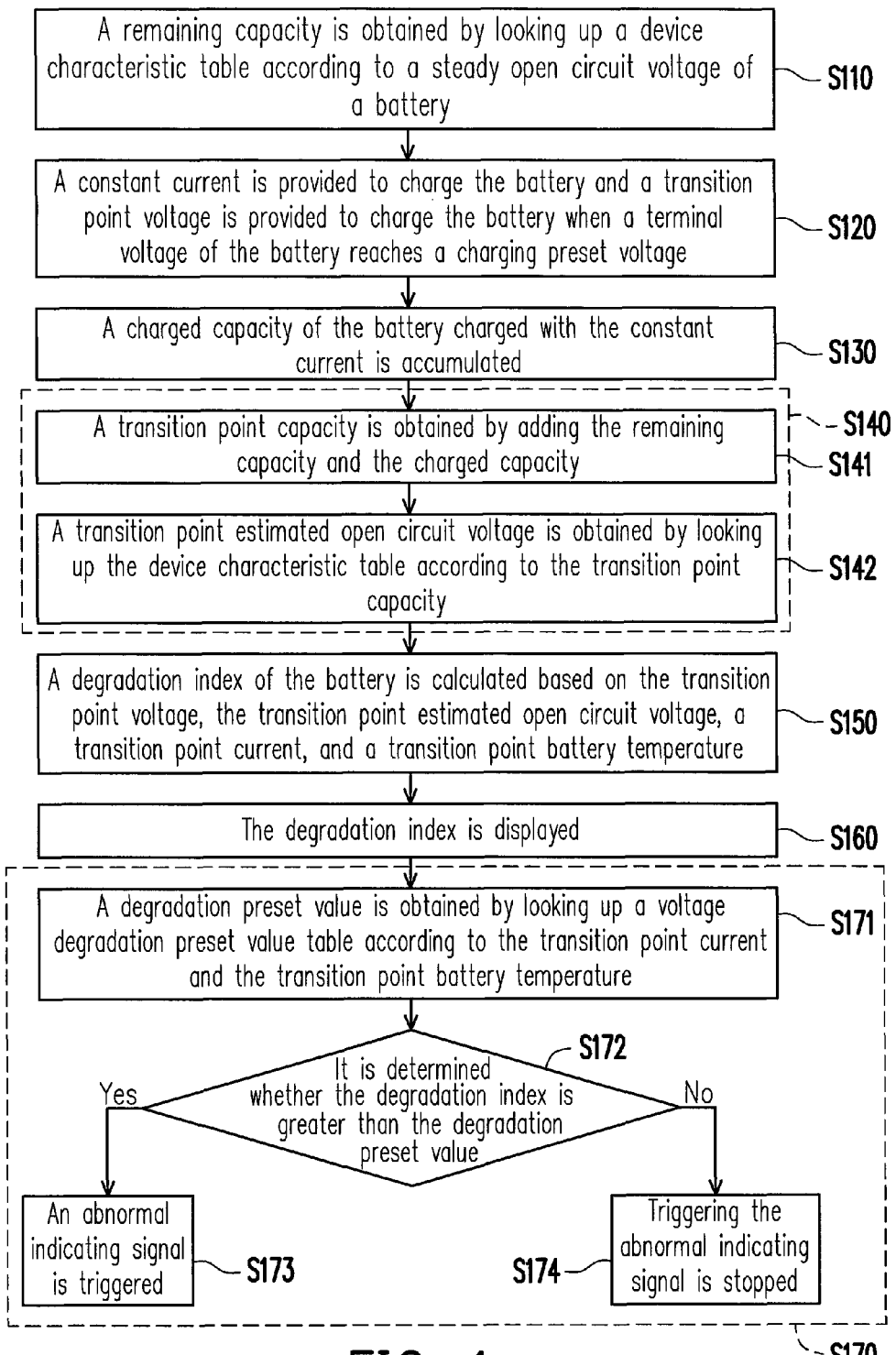
FIG. 1 is a flow chart of a method for estimating battery degradation according to an exemplary embodiment.

FIG. 1 is a flow chart of a method for estimating battery degradation according to an exemplary embodiment. Referring to FIG. 1, at step S110, a remaining capacity is obtained by looking up a device characteristic table according to a steady open circuit voltage (steady OCV) of a battery. The device characteristic table refers to an OCV-versus-capacity characteristic table of a battery. The battery capacity may be a charged capacity, a discharged capacity or a remaining capacity of the battery, and the unit of the capacity may be presented as watt-hour (Wh), ampere-hour (Ah) or percentage (%).

For example, FIG. 2A is a characteristic curve diagram of a battery according to an exemplary embodiment, in which the curve 210 is an actual battery steady OCV curve which shows the relationship between a steady open circuit voltage and a remaining capacity of a battery, while the curve 220 is a battery charging voltage curve which shows the relationship between a terminal voltage and the remaining capacity of the battery. Here, the relationship between the open circuit voltage and the remaining capacity shown by the curve 210 is stored in the device characteristic table. As such, before the battery is charged, the remaining capacity of the battery before charging may be obtained by referring to the curve 210 (i.e. the device characteristic table) according to the steady open circuit voltage OCV1 of the battery.

In addition, at step S120, a constant current is provided to charge the battery. When a terminal voltage of the battery reaches a charging preset voltage, a constant voltage is provided to charge the battery and, at the same time, a temperature of the battery is recorded to obtain a transition point battery temperature. In other words, this exemplary embodiment utilizes a mixed constant current/constant voltage charging method, i.e. a constant current/constant voltage mixed charging procedure, to charge the battery. For example, as shown in FIG. 2A, at a first stage T21, the constant current/constant voltage mixed charging procedure switches to a constant current mode such that a constant current is used to charge the battery. At this time, as shown by the curve 220, the terminal voltage of the battery increases gradually during the first stage T21. In addition, when the terminal voltage of the battery increases to a charging preset voltage (e.g. a transition point voltage Vch), the mixed charging procedure switches to a second stage T22. At the second stage T22, the constant current/constant voltage charging procedure switches to a constant voltage mode such that the transition point voltage Vch is used to charge the battery. Therefore, as shown by the curve 220, the terminal voltage of the battery is maintained at the transition point voltage Vch during the second stage T22.

Then, at step S130, during charging of the battery, the charged capacity of the battery that is charged with the constant current, i.e. the charged capacity obtained in the constant current mode, is accumulated. For example, as shown in FIG. 2A, during the first stage T21, the charged amount that actually enters the battery is accumulated to obtain the charged capacity $\Delta Q21$.

Then, at step S140, a transition point estimated open circuit voltage OCV2 is obtained by looking up the device characteristic table using the remaining capacity and the charged capacity. For example, as shown in FIG. 2A, a transition point capacity Q2 may be calculated by adding the remaining capacity Q1 and the charged capacity $\Delta Q21$. In addition, a corresponding transition point estimated open circuit voltage OCV2 may be obtained by referring to the curve 210 (i.e. the device characteristic table) according to the transition point capacity Q2. In other words, details of step S140 include that, at step S141, the remaining capacity and the charged capacity during the constant current stage are added to obtain the transition point capacity; and, at step S142, the transition point estimated open circuit voltage is obtained by looking up the device characteristic table according to the transition point capacity.

In other words, this exemplary embodiment first obtains the remaining capacity Q1 of the battery at step S110 before the constant current/constant voltage mixed charging procedure (step S120) is performed, and accumulates the charged capacity $\Delta Q21$ of the battery after the constant current/constant voltage mixed charging procedure (S120) starts. As such, the transition point capacity can be calculated based on the remaining capacity Q1 and the charged capacity $\Delta Q21$, and the transition point estimated open circuit voltage OCV2 can then be obtained by referring to a lookup table. That is, this exemplary embodiment calculates the transition point estimated open circuit voltage OCV2 through the step S110 prior to the constant current/constant voltage mixed charging procedure (step S120) and the steps S130 and S140 after the constant current/constant voltage mixed charging procedure (step S120) starts.

However, in practice, calculating the transition point capacity Q2 can be done in many ways. In other words, calculating the transition point estimated open circuit voltage OCV2 is not intended to be limited to the above embodiment. For example, FIG. 2B is a flow chart of calculating a transition point estimated open circuit voltage according to another exemplary embodiment. Referring to FIG. 2A and FIG. 2B, after the constant current/constant voltage mixed charging procedure (step S120) starts, at step S210, a charged capacity $\Delta Q22$ of the battery obtained in the constant voltage mode is accumulated. In addition, after the constant current/constant voltage mixed charging procedure (step S120) is completed, at step S220, the battery is rested for a period of time to allow a steady open circuit voltage OCV3 of the battery to be obtained, and the steady open circuit voltage OCV3 of the battery is used to look up the device characteristic table to obtain a lookup capacity Q3, where $Q3=Q2+\Delta Q22$. At step S230, the transition point capacity Q2 is then obtained by subtracting the charged capacity $\Delta Q22$ from the lookup capacity Q3. As such, at step S240, the transition point estimated open circuit voltage OCV2 can be obtained by looking up the device characteristic table again according to the transition point capacity Q2.

In other words, when it is not possible to obtain the remaining capacity Q1 by looking up a table according to the steady open circuit voltage before the battery is charged, the battery can be directly charged and, after the charging procedure is completed, the charged capacity is equal to the lookup capacity Q3. If, after the charging procedure is completed, there is a sufficient rest time to allow the steady open circuit voltage OCV3 of the battery to be obtained, the lookup capacity Q3 can then be obtained by looking up the table according to the steady open circuit voltage OCV3. Afterwards, the transition point capacity Q2 can likewise be obtained by subtracting the charged capacity of the battery $\Delta Q22$ ($\Delta Q22=Q3-Q2$) obtained in the constant voltage charging mode from the lookup capacity Q3, and the transition point estimated open circuit voltage OCV2 can further be obtained by looking up the table according to the transition point capacity Q2.

It is noted that there is an actual voltage difference $\Delta V$ between the transition point voltage Vch and the transition point estimated open circuit voltage OCV2. The magnitude of the actual voltage difference $\Delta V$ is dependent on an internal resistance of the battery and indicates an energy loss of the battery during charging. A higher actual voltage difference $\Delta V$ reflects a poorer charging performance of the battery as well as higher degrees of battery degradation. Therefore, this exemplary embodiment mainly utilizes this actual voltage difference $\Delta V$ to calculate a degradation index, while taking into account the effect of transition point current and transition point battery temperature on the battery degradation.

Figure 3:
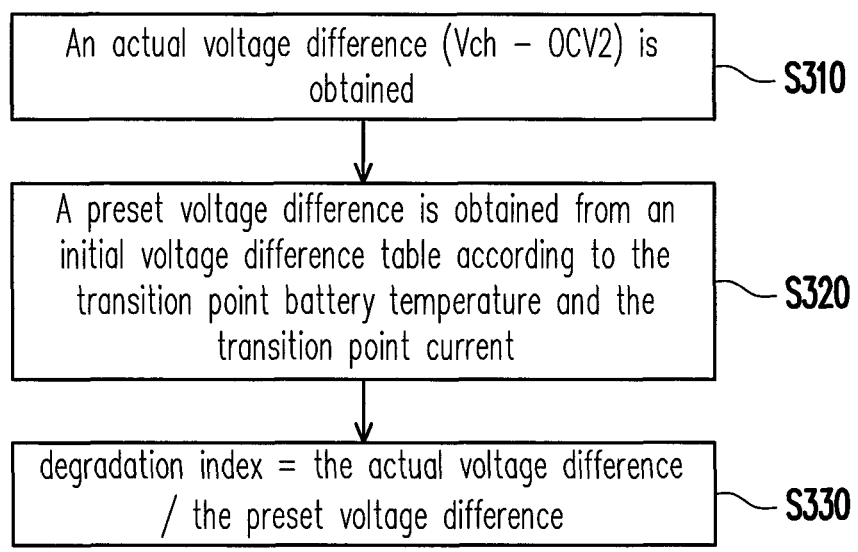
FIG. 3 is a detailed flow chart of calculating a degradation index according to an exemplary embodiment.

For example, at step S150, the degradation index is calculated based on the transition point voltage, transition point estimated open circuit voltage, transition point current and transition point battery temperature. In addition, FIG. 3 is a detailed flow chart of calculating a degradation index according to an exemplary embodiment. The detailed flow chart of step S150 is explained below with reference to both FIG. 2A and FIG. 3.

During calculating the degradation index, at step S310, an actual voltage difference ΔV is obtained by subtracting the transition point estimated open circuit voltage OCV2 from the charging preset voltage (e.g. the transition point voltage Vch). In addition, at step S320, a preset voltage difference is obtained from an initial voltage difference table according to the transition point battery temperature and the transition point current. As such, at step S330, the degradation index is obtained by dividing the actual voltage difference ΔV by the preset voltage difference. For example, Table 1 is an initial voltage difference table according to an exemplary embodiment. Assuming the transition point battery temperature of the battery is 20 degrees and the transition point current is 1.5 ampere, a preset voltage difference {0.02} can be obtained from the data stored in Table 1 using an interpolation method. In addition, assuming the actual voltage difference ΔV is 0.03, then the degradation index of the battery is 1.5.

TABLE 1

Initial Voltage Difference Table

| Temperature | Transition Point Current | | | |
|---|---|---|---|---|
| | 0.5 | 1.5 | 2.5 | 3.5 |
| 0 | 0.1000 | 0.3000 | 0.5000 | 0.7000 |
| 15 | 0.0100 | 0.0250 | 0.0500 | 0.0700 |
| 30 | 0.0050 | 0.0100 | 0.0250 | 0.0350 |
| 45 | 0.0015 | 0.0045 | 0.0075 | 0.0105 |

With continuous reference to FIG. 1, the calculated degradation index is displayed at step S160 and it is determined whether to trigger an abnormal indicating signal at step S170. It is to be understood that the degradation index can also be stored in a memory of a battery management system without being displayed. The detailed flow chart of the determination of whether to trigger the abnormal indicating signal is explained with reference to steps S171 to S174. At step S171, a degradation preset value is obtained by looking up a voltage degradation preset value table according to the transition point current and the transition point battery temperature. In addition, at step S172, it is determined whether the degradation index is greater than the degradation preset value. At steps S173 and S174, if the degradation index is greater than the degradation preset value, an abnormal indicating signal is triggered, for example, by turning on an indicator light. Otherwise, triggering the abnormal indicating signal is stopped, for example, by turning off the indicator light.

For example, Table 2 is a voltage degradation preset value table according to an exemplary embodiment. Assuming the transition point battery temperature is 20 degrees and the transition point current is 1.5 ampere, a degradation preset value {2.4} can be obtained from the data stored in Table 2 using an interpolation method. In addition, if the degradation index of the battery is 1.5, then the abnormal indicator light is turned off because the current degradation index {1.5} is less than the degradation present value {2.4}.

TABLE 2

Voltage Degradation Preset Value Table

| Temperature | Transition Point Current | | | |
|---|---|---|---|---|
| | 0.5 | 1.5 | 2.5 | 3.5 |
| 0 | 3 | 4 | 5 | 6 |
| 15 | 2.4 | 2.5 | 2.6 | 2.7 |
| 30 | 2.1 | 2.2 | 2.3 | 2.4 |
| 45 | 1.6 | 1.7 | 1.8 | 1.9 |

In general, in this exemplary embodiment, the battery degradation is evaluated by measuring the voltage difference at the transition from constant current to constant voltage during a stable charging of the battery. In other words, in this exemplary embodiment, the battery degradation can be detected without specially modifying or interrupting the battery charging operation and without the need of additional hardware. In addition, in this exemplary embodiment, a huge table is not required to record or calculate the battery degradation. Therefore, this exemplary embodiment facilitates reducing the system hardware cost and system complexity.

Besides, although users are concerned about the internal resistance of the battery during discharging, the accuracy of the internal resistance measurement is decreased due to current variation caused by load variation during discharging. On the contrary, batteries are mostly charged with a CC-CV (constant current-constant voltage) charging method and, therefore, the current during charging is stable and the estimation result can be achieved with higher accuracy. Therefore, the exemplary embodiment utilizes relevant parameters of the battery during charging to evaluate the battery degradation. As a result, this exemplary embodiment can still estimate the battery degradation during a normal use of the battery.

Figure 4:
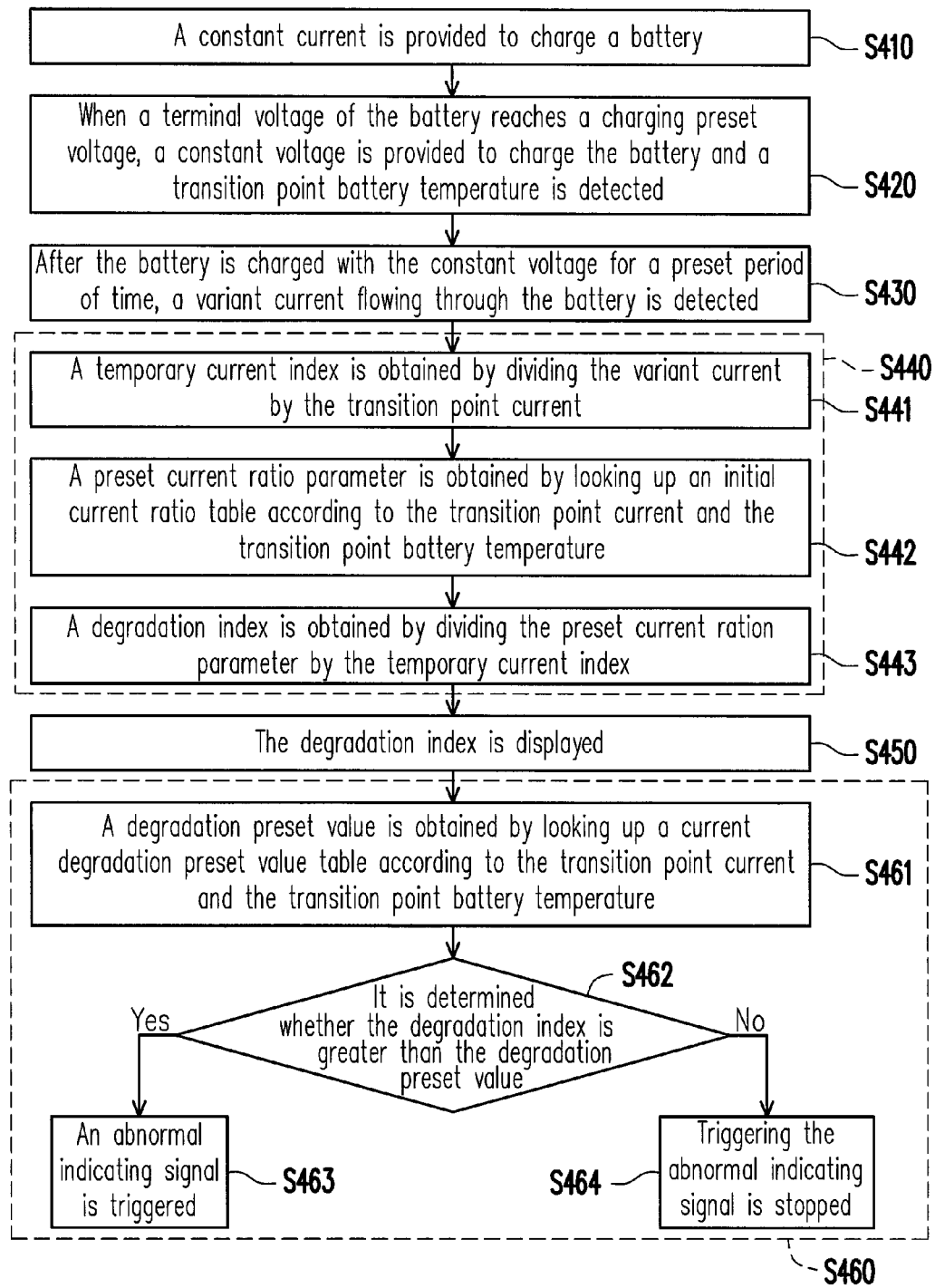
FIG. 4 is a flow chart of a method for estimating battery degradation according to another exemplary embodiment.

FIG. 4 is a flow chart of a method for estimating battery degradation according to another exemplary embodiment. At step S410, in a common CC-CV charging method, the battery is first charged with a constant current and then switched to be charged with a constant voltage after the battery voltage reaches a charging preset voltage. Therefore, at step S420, when a terminal voltage of the battery reaches a charging preset voltage, the battery is switched to be charged with a constant voltage and a transition point battery temperature is detected. In this exemplary embodiment, the battery degradation is estimated mainly based on current variation during the constant voltage charging.

Figure 5:
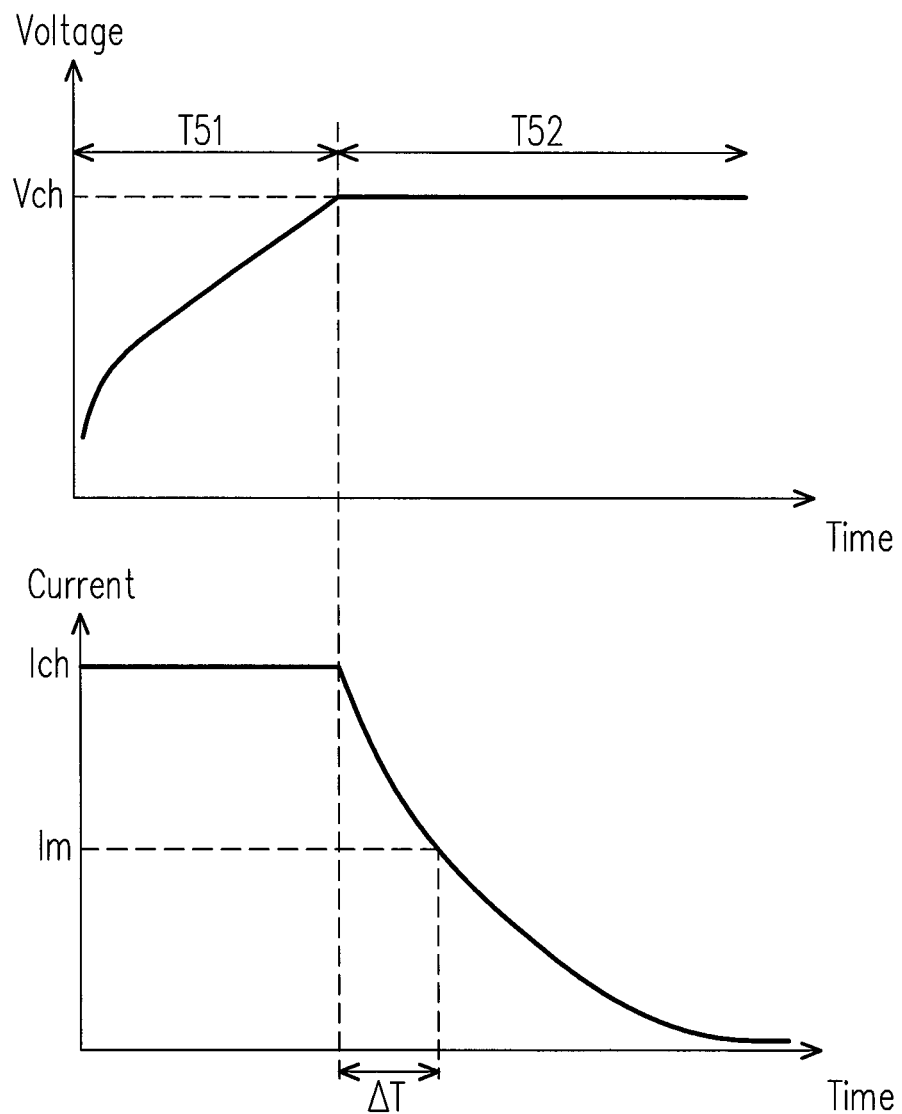
FIG. 5 is a curve diagram of charging a battery according to an exemplary embodiment.

For example, FIG. 5 is a curve diagram of charging a battery according to an exemplary embodiment, in which an upper part of FIG. 5 shows the variation of the terminal voltage of the battery with time during charging, and a lower part of FIG. 5 shows the variation of the current of the battery with time during charging. As shown in FIG. 5, at a first stage T51, the battery is charged with a constant current (e.g. a transition point current Ich). At this time, the current of the battery is maintained at the transition point current Ich, and the terminal voltage of the battery increases gradually. In addition, at a second stage T52, the battery is charged with a constant voltage (e.g. a transition point voltage Vch). At this time, the terminal voltage of the battery is maintained at the transition point voltage Vch, and the current of the battery decreases gradually. Once the charging procedure passes the transition point, the transition point battery temperature is recorded.

It is noted that the current of the battery decreases at a higher rate with increasing of the internal resistance or decreasing of an internal capacity of the battery. Therefore, the battery degradation can be evaluated according to a current decrease rate of the battery after the transition from the constant current charging to the constant voltage charging. A greater current decrease rate indicates a higher internal resistance of the battery as well as greater degrees of battery degradation. Therefore, this exemplary embodiment mainly utilizes a variant current detected after the battery is charged with a constant voltage for a preset period of time to calculate a degradation index, while taking into account the effect of the transition point current and transition point battery temperature on the battery degradation.

For example, at step S430, after the battery is charged with the constant voltage for a preset period of time, a variant current flowing through the battery is detected. As shown in FIG. 5, after the battery is charged with the constant voltage for a preset period of time ΔT, a variant current Im of the battery is detected. In addition, at step S440, the degradation index is calculated from the transition point current, transition point battery temperature and variant current.

In calculating the degradation index, at step S441, a temporary current index is obtained by dividing the variant current by the transition point current. For example, the temporary current index c2=Im/Ich. In addition, at step S442, a preset current ratio parameter is obtained by looking up an initial current ratio table according to the transition point current and the transition point battery temperature. Then, at step S443, the degradation index is obtained by dividing the preset current ratio parameter by the temporary current index.

For example, Table 3 shows an initial current ratio table according to an exemplary embodiment. Assuming the transition point battery temperature is 20 degrees and the transition point current is 1.5 ampere, a preset current ratio parameter {0.72} can be obtained from the data stored in Table 3 using an interpolation method. In addition, assuming the temporary current index is 0.504, then the degradation index of the battery is 1.429.

TABLE 3

Initial Current Ratio Table

| Temperature | Transition Point Current | | | |
|---|---|---|---|---|
| | 0.5 | 1.5 | 2.5 | 3.5 |
| 0 | 0.70 | 0.60 | 0.50 | 0.40 |
| 15 | 0.75 | 0.68 | 0.60 | 0.52 |
| 30 | 0.86 | 0.80 | 0.74 | 0.68 |
| 45 | 0.90 | 0.85 | 0.80 | 0.75 |

With continuous reference to FIG. 4, the calculated degradation index is displayed at step S450 and it is determined whether to display an abnormal indicating signal at step S460. The detailed flow chart of the determination of whether to trigger the abnormal indicating signal is explained with reference to steps S461 to S464. At step S461, a degradation preset value is obtained by looking up a current degradation preset value table according to the transition point current and the transition point battery temperature. In addition, at step S462, it is determined whether the degradation index is greater than the degradation preset value. At steps S463 and S464, if the degradation index is greater than the degradation preset value, an abnormal indicating signal is triggered, for example, by turning on an indicator light. Otherwise, triggering the abnormal indicating signal is stopped, for example, by turning off the indicator light.

For example, Table 4 is a current degradation preset value table according to another exemplary embodiment. Assuming the transition point battery temperature is 20 degrees and the transition point current is 1.5 ampere, a degradation preset value {1.38} can be obtained from the data stored in Table 4 using an interpolation method. In addition, if the degradation index of the battery is 1.429, then the abnormal indicator light is turned on because the current degradation index {1.429} is greater than the degradation present value {1.38}.

TABLE 4

Current Degradation Preset Value Table

| Temperature | Transition Point Current | | | |
|---|---|---|---|---|
| | 0.5 | 1.5 | 2.5 | 3.5 |
| 0 | 1.4 | 1.5 | 1.7 | 2 |
| 15 | 1.3 | 1.42 | 1.55 | 1.65 |
| 30 | 1.2 | 1.3 | 1.4 | 1.5 |
| 45 | 1.1 | 1.2 | 1.3 | 1.4 |

In summary, in exemplary embodiments, the battery degradation is estimated according to the voltage difference at the transition from the constant current charging to the constant voltage charging, or the current decrease rate after the transition from the constant current charging to the constant voltage charging. Therefore, the battery degradation can be estimated without the need of additional hardware and without interrupting the battery charging operation. In addition, a huge table is not required to record or calculate the battery degradation. Therefore, the exemplary battery degradation estimating method facilitates reducing the system hardware cost and system complexity.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method for estimating battery degradation, adapted to a battery management system and comprising:
    charging a battery with a constant current/constant voltage mixed charging procedure through the battery management system, wherein the battery is charged in a constant current mode when a terminal voltage of the battery has not reached a charging preset voltage, and the battery is charged in a constant voltage mode when the terminal voltage of the battery has reached the charging preset voltage;
    before the constant current/constant voltage mixed charging procedure is performed, obtaining a remaining capacity by looking up a device characteristic table according to a steady open circuit voltage of the battery;
    after the constant current/constant voltage mixed charging procedure starts, accumulating a charged capacity of the battery obtained in the constant current mode;
    obtaining a transition point capacity by adding the remaining capacity and the charged capacity; and
    obtaining the transition point estimated open circuit voltage by looking up the device characteristic table again according to the transition point capacity; and
    calculating a degradation index of the battery based on a transition point voltage, the transition point estimated open circuit voltage, a transition point current, and a transition point battery temperature at a transition from the constant current mode to the constant voltage mode during the constant current/constant voltage mixed charging procedure.

2. The method for estimating battery degradation according to claim 1, further comprising:
calculating the transition point estimated open circuit voltage.

3. The method for estimating battery degradation according to claim 1, wherein the step of calculating the degradation index of the battery based on the transition point voltage, the transition point estimated open circuit voltage, the transition point current, and the transition point battery temperature comprises:
obtaining an actual voltage difference by subtracting the transition point estimated open circuit voltage from the transition point voltage;
obtaining a preset voltage difference by looking up an initial voltage difference table according to the transition point current and the transition point battery temperature; and
obtaining the degradation index by dividing the actual voltage difference by the preset voltage difference.

4. The method for estimating battery degradation according to claim 1, further comprising:
displaying the degradation index or determining whether to trigger an abnormal indicating signal.

5. The method for estimating battery degradation according to claim 4, wherein the step of determining whether to trigger the abnormal indicating signal comprises:
obtaining a degradation preset value by looking up a voltage degradation preset value table according to the transition point current and the transition point battery temperature;
determining whether the degradation index is greater than the degradation preset value;
triggering the abnormal indicating signal when the degradation index is greater than the degradation preset value; and
stopping triggering the abnormal indicating signal when the degradation is not greater than the degradation preset value.

6. The method for estimating battery degradation according to claim 1, wherein the device characteristic table is configured to record the relationship between the open circuit voltage and capacity of the battery.

7. A method for estimating battery degradation, adapted to a battery management system and comprising:
charging a battery with a constant current/constant voltage mixed charging procedure through the battery management system, wherein the battery is charged in a constant current mode when a terminal voltage of the battery has not reached a charging preset voltage, and the battery is charged in a constant voltage mode when the terminal voltage of the battery has reached the charging preset voltage;
recording a transition point current and a transition point battery temperature when the constant current/constant voltage mixed charging procedure switches from the constant current mode to the constant voltage mode, wherein the transition point current and the transition point battery temperature are recorded in a memory of the battery management system;
detecting a variant current of the battery through the battery management system after the battery is charged in the constant voltage mode for a preset period of time; and
calculating a degradation index based on the transition point current, the transition point battery temperature and the variant current.

8. The method for estimating battery degradation according to claim 7, wherein the step of calculating the degradation index based on the transition point current, the transition point battery temperature and the variant current comprises:
obtaining a temporary current index by dividing the variant current by the transition point current;
obtaining a preset current ratio parameter by looking up an initial current ratio table according to the transition point current and the transition point battery temperature; and
obtaining the degradation index by dividing the preset current ratio parameter by the temporary current index.

9. The method for estimating battery degradation according to claim 7, further comprising:
displaying the degradation index or determining whether to trigger an abnormal indicating signal.

10. The method for estimating battery degradation according to claim 9, wherein the step of determining whether to trigger the abnormal indicating signal comprises:
obtaining a degradation preset value by looking up a current degradation preset value table according to the transition point current and the transition point battery temperature;
determining whether the degradation index is greater than the degradation preset value;
triggering the abnormal indicating signal when the degradation index is greater than the degradation preset value; and
stopping triggering the abnormal indicating signal when the degradation is not greater than the degradation preset value.

11. A method for estimating battery degradation, applied to a battery management system, and comprising:
charging a battery with a constant current/constant voltage mixed charging procedure through the battery management system, wherein the battery is charged in a constant current mode when a terminal voltage of the battery has not reached a charging preset voltage, and the battery is charged in a constant voltage mode when the terminal voltage of the battery has reached the charging preset voltage;
after the constant current/constant voltage mixed charging procedure starts, accumulating a charged capacity of the battery obtained in the constant voltage mode through the battery management system;
after the constant current/constant voltage mixed charging procedure is completed, resting the battery to obtain a steady open circuit voltage of the battery through the battery management system and obtaining a lookup capacity after the battery charging is completed by looking up a device characteristic table according to the steady open circuit voltage, wherein the device characteristic table is stored in a memory of the battery management system;
obtaining a transition point capacity by subtracting the charged capacity from the lookup capacity;
obtaining a transition point estimated open circuit voltage by looking up the device characteristic table again according to the transition point capacity; and
calculating a degradation index of the battery based on a transition point voltage, the transition point estimated open circuit voltage, a transition point current, and a transition point battery temperature at a transition from the constant current mode to the constant voltage mode during the constant current/constant voltage mixed charging procedure.

* * * * *

UNITED STATES PATENT AND TRADEMARK OFFICE
CERTIFICATE OF CORRECTION

Page 1 of 1

PATENT NO. : 9,229,064 B2
APPLICATION NO. : 13/645523
DATED : January 5, 2016
INVENTOR(S) : Chung-Jen Chou et al.

It is certified that error appears in the above-identified patent and that said Letters Patent is hereby corrected as shown below:

On the Title Page of the patent grant, the item (30) Foreign Priority Application Data
--December 26, 2011 (TW)......100148621-- should be shown.

Signed and Sealed this
Twenty-sixth Day of April, 2016

Michelle K. Lee
*Director of the United States Patent and Trademark Office*